United States Patent [19]

Saika et al.

[11] Patent Number: 5,060,040

[45] Date of Patent: Oct. 22, 1991

[54] PHOTOELECTRIC CONVERSION APPARATUS

[75] Inventors: Toshihiro Saika; Noriyuki Kaifu, both of Hiratsuka, Japan

[73] Assignee: Canon Kabushiki Kaisha, Tokyo, Japan

[21] Appl. No.: 269,703

[22] Filed: Nov. 10, 1988

[30] Foreign Application Priority Data

Nov. 14, 1987 [JP] Japan .............................. 62-288199

[51] Int. Cl.⁵ ...................... H01L 27/14; H01L 31/00
[52] U.S. Cl. .................................. 357/30; 250/208.1; 250/211 R; 250/578.1; 358/494
[58] Field of Search ................. 357/30 I, 30 K, 30 L, 357/30 Q, 30 O, 30 D, 19, 30 G, 30 H, 32, 52, 71, 2; 358/213.11, 213.13, 213.15, 494; 250/211 J, 211 R, 575.1, 208.1

[56] References Cited

U.S. PATENT DOCUMENTS

| 4,471,371 | 9/1984 | Hamano | 357/30 Q |
|---|---|---|---|
| 4,650,984 | 3/1987 | Furushima et al. | 250/211 R |
| 4,743,955 | 5/1988 | Matsumoto | 357/30 D |
| 4,746,962 | 5/1988 | Yamazaki | 357/30 Q |
| 4,788,445 | 11/1988 | Hatanaka et al. | 357/30 Q |
| 4,827,146 | 5/1989 | Ogawa et al. | 357/30 Q |
| 4,845,355 | 7/1989 | Nakagawa et al. | 250/211 J |
| 4,874,957 | 10/1989 | Sasaki et al. | 357/30 L |
| 4,908,718 | 3/1990 | Shimada | 358/213.11 |
| 4,910,412 | 3/1990 | Ondris | 357/32 |
| 4,916,304 | 4/1990 | Itabashi et al. | 250/211 R |
| 4,922,117 | 5/1990 | Saika et al. | 250/211 R |
| 4,924,282 | 5/1990 | Komiyama et al. | 357/72 |
| 4,931,661 | 6/1990 | Fukaya et al. | 250/211 R |
| 4,937,651 | 6/1990 | Yamazaki et al. | 357/52 |
| 4,939,592 | 7/1990 | Saika et al. | 250/208.1 |
| 4,953,000 | 8/1990 | Kaiju et al. | 357/30 H |
| 4,982,079 | 1/1991 | Yagyu | 250/208.1 |

FOREIGN PATENT DOCUMENTS

| 0141264 | 8/1984 | Japan | 357/30 L |
|---|---|---|---|
| 0177682 | 9/1985 | Japan | 357/30 L |
| 0030069 | 2/1986 | Japan | 357/30 Q |
| 0148870 | 7/1986 | Japan | 357/30 L |
| 61-199660 | 9/1986 | Japan | 357/30 L |
| 0289661 | 12/1986 | Japan | 357/30 Q |

Primary Examiner—Rolf Hille
Assistant Examiner—Minh Loan Tran
Attorney, Agent, or Firm—Fitzpatrick, Cella, Harper & Scinto

[57] ABSTRACT

A photoelectric conversion apparatus includes a photoelectric conversion section for receiving light reflected from an original, and an electric charge storage section having an electrode electrically connected to an electrode of the photoelectric conversion unit. The electric charge storage section comprises a lamination structure including a dielectric layer and two electrodes respectively provided at upper and lower sides of the dielectric layer. The electrode closest to the original is maintained at a constant potential.

12 Claims, 5 Drawing Sheets

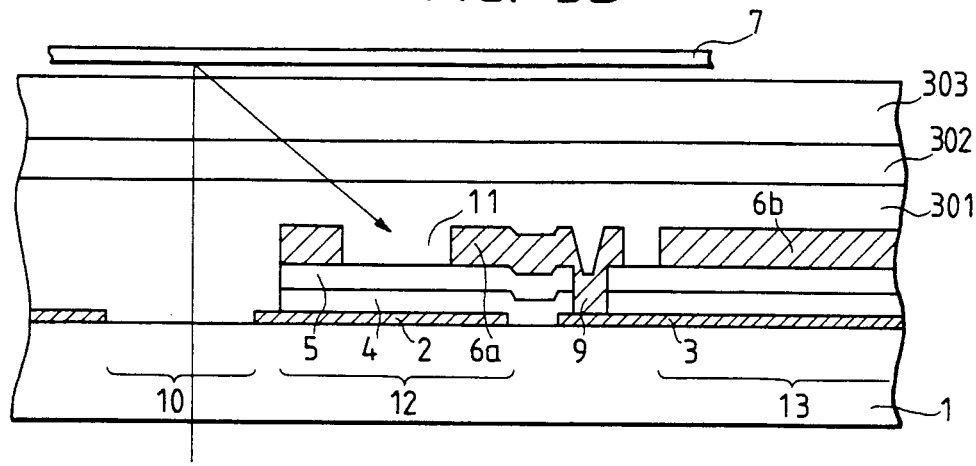
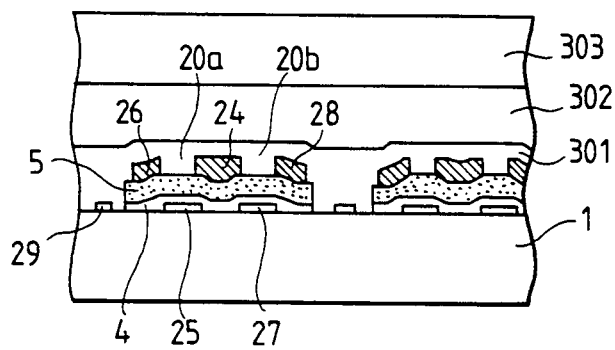
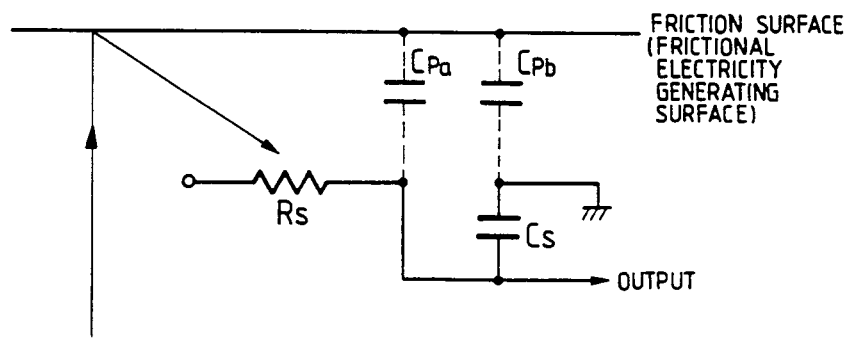

PHOTOELECTRIC CONVERSION APPARATUS

BACKGROUND OF THE INVENTION

1. Field of the Invention

The present invention relates to photoelectric conversion apparatus, and more particularly to apparatus suitable for use in a facsimile device, an image reader, a digital copying device or the like which reads image information from an original by moving the document relative to such a device in contact therewith.

2. Related Background Art

Most conventional photoelectric conversion apparatuses of this (called a contact type photoelectric conversion apparatus) use an array of rod lenses or focusing fibers to project an image on a document to a photosensor or a group of photosensors including a photoelectric conversion element to thereby read the image.

For cost reduction and miniaturization purposes, photoelectric conversion apparatus have recently been developed extensively which include a thin transparent protective layer formed on a photosensor whereby a document is moved in contact with the protective layer to read the document.

FIG. 1 is a schematic of a cross sectional view showing one part of a photoelectric conversion apparatus of this type.

FIG. 2 is an equivalent circuit diagram of one part of the conversion apparatus.

As shown in FIG. 1, the light emitted from a light source (not shown) disposed on the back side of a transparent insulating substrate 1 is irradiated onto a document 7 through an opening 11 provided on the opposite side of the substrate 1 and the light reflected by the document is now irradiated onto a photoelectric conversion section 12 through a light entrance opening 11. The irradiated quantity of light according to the image information of the original 7 changes the conductivity of a semiconductor layer correspondingly, the electric charges produced by photoelectric conversion at the photoelectric conversion section 12 (corresponding to Rs in FIG. 2) are stored in an upper layer electrode 6 of an electric charge storage section 13 (corresponding to Cs in FIG. 2).

The photoelectric conversion section 12 and the electric charge storage section 13 include an opaque layer 2 and a lower layer electrode 3, respectively, formed on a common transparent insulating substrate 1. The sections 12 and 13 further include an insulating layer 4, a semiconductor layer 5 and an upper opaque layer electrode 6 in this order on the layers 2 and 3 with the light entrance opening 11 in the upper layer electrode 6 which constitutes part of the photoelectric conversion section 12. The sections further include in common a plurality of transparent insulating protective layers 301, 302, 303 on the upper layer electrode 6.

However, since the uppermost transparent insulating protective layer 303 has a generally high insulation in the conventional apparatus, static charges are produced on the protective layer 303 as the document 7 moves along the protective layer 303 while contacting same. A stray capacitance Cp formed as shown in FIG. 2 may cause level shifting of a signal or a malfunction of a signal processor.

SUMMARY OF THE INVENTION

It is an object of the present invention to solve the problems with the operation of a photoelectric conversion apparatus having a transparent insulating protective layer, produced due to the charging of the transparent insulating protective layer.

The solution of the above problems is achieved by a photoelectric conversion apparatus according to the present invention. The apparatus comprises:

a plurality of photoelectric conversion units including a semiconductor layer and a pair of first electrodes on an insulating substrate;

a plurality of electric charge storage sections which include a second electrode, a dielectric layer and a third electrode superposed sequentially on the insulating substrate; and a transparent insulating protective layer on the photoelectric conversion units and the charge storage sections;

one of the first electrodes and second electrodes being electrically connected and the third electrode being maintained at a constant potential.

To hold the third electrode at a constant potential is achieved, for example, by connecting the third electrode to a point of which the potential does not substantially fluctuate, for example, ground.

As described above, the electric charge storage section includes the second electrode, dielectric layer, third electrode, transparent insulating protective layer superposed in this order on the transparent insulating substrate with the first electrode and the second electrode of the photoelectric conversion unit being electrically connected, whereby the electric charges produced by photoelectric conversion at the photoelectric conversion units are stored on the second electrode, and the third electrode is maintained at constant potential. Thus the static charges produced on the transparent insulating protective layer are prevented from influencing the second electrode.

BRIEF DESCRIPTION OF THE DRAWINGS

FIGS. 3A–3C are schematic illustrations of one embodiment of a photoelectric conversion apparatus according to the present invention.

FIG. 4 is an equivalent circuit diagram of the image reader of the inventive photoelectric conversion apparatus.

DETAILED DESCRIPTION OF THE PREFERRED EMBODIMENT

An embodiment of the present invention will now be described in detail with reference to the drawings.

Figure 1:
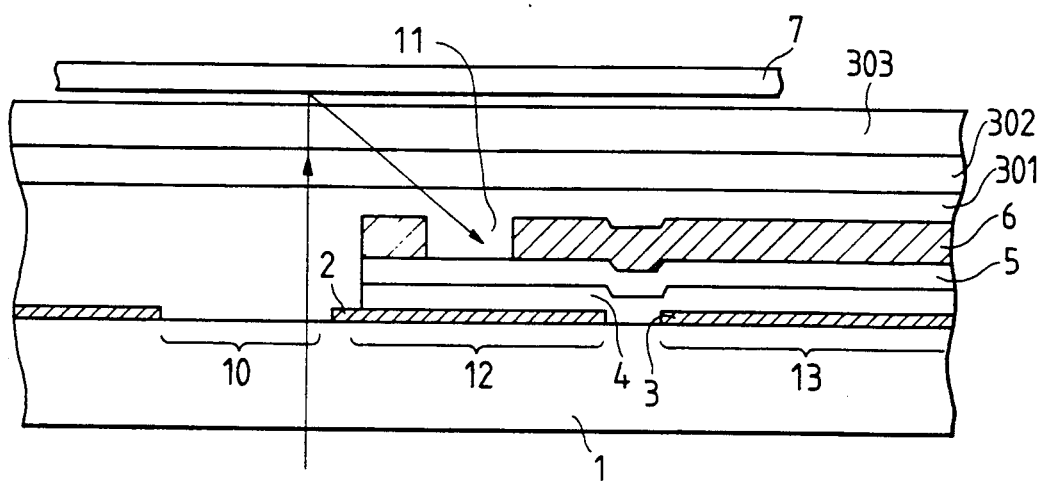
FIG. 1 is a schematic cross section view showing an illustrative structure of a conventional image reader.

In the following description, like reference numerals are used to denote like components of the photoelectric conversion apparatus throughout FIGS. 1, 2 and subsequent Figures.

FIG. 3 shows a 2-bit portion of a photoelectric conversion apparatus according to the present invention.

Figure 3A:
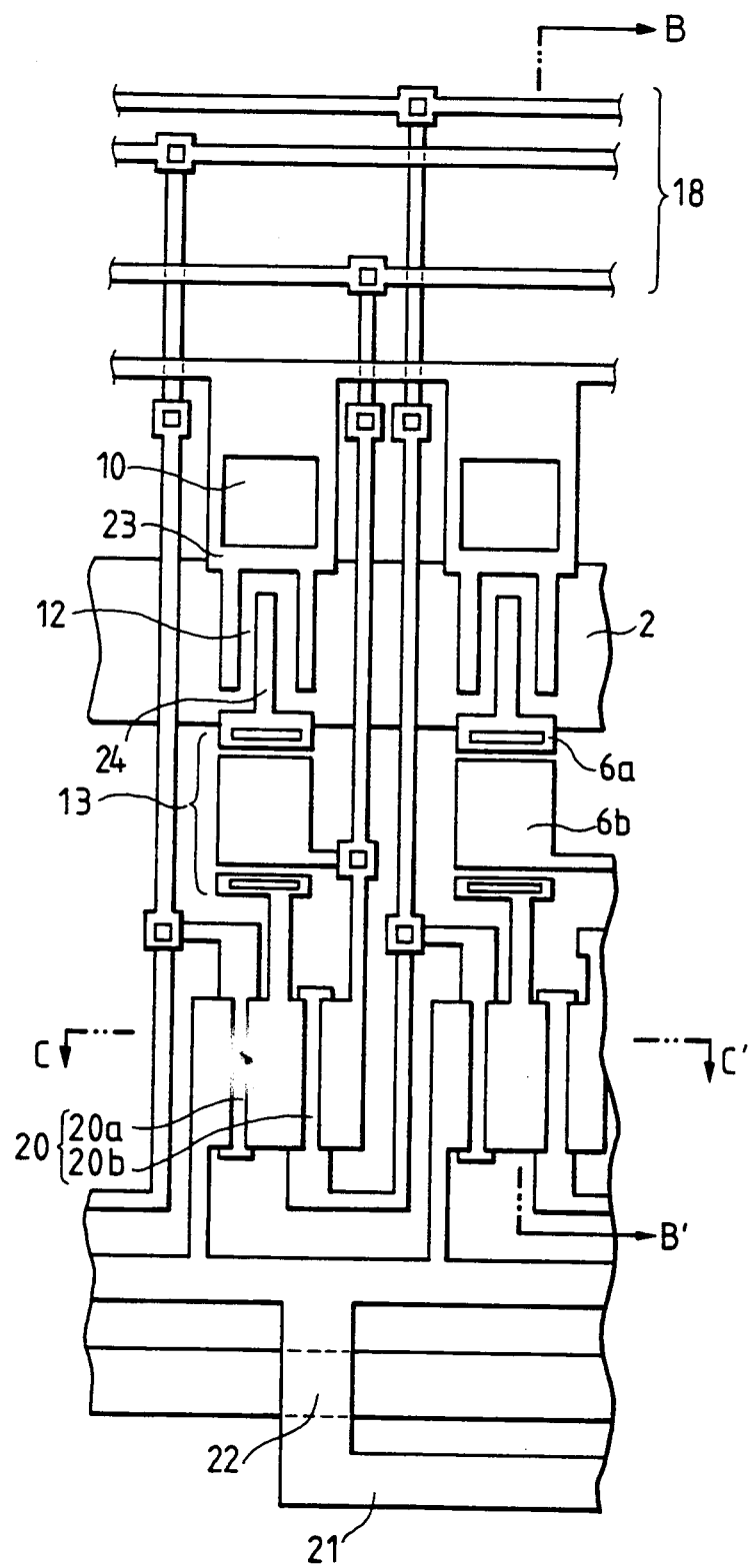

FIG. 3A is a plan view of the 2-bit portion, FIG. 3B is a cross section view taken along the line B—B' in FIG. 3A, and FIG. 3C is a cross section view taken along the line C—C' in FIG. 3A.

FIG. 4 is an equivalent circuit diagram of the photoelectric conversion apparatus.

In the particular embodiment shown, the photoelectric conversion apparatus includes a photoelectric conversion unit, an electric charge storage section, a switching thin film transistor section, and a wiring matrix formed integrally on the same substrate. While FIG. 3A shows only the 2-bit structural portion of the apparatus, the actual photoelectric conversion apparatus includes a one-dimensional photoelectric conversion apparatus including a plurality of 1-bit structural portions arranged in a line on the substrate. For example, if the apparatus has to have a resolution of 8 lines/mm through 216 mm corresponding to the width of an A4-size document in the direction transverse to a document P (perpendicular to the direction of movement of the document), it will have 1,728 photoelectric conversion units arranged.

In the particular embodiment, the photoelectric conversion units, electric charge storage sections for storing the outputs from the photoelectric conversion units, switching sections for transferring the stored electric charges and processing signals, and required wiring patterns, etc., are formed on the substrate using the same manufacturing steps.

Formed on the transparent insulating substrate 1 as shown in FIGS. 3A–C, are a matrix wiring section 18, photoelectric conversion units 12, electric charge storage sections 13, switch sections 20 including a transferring switch 20a and a discharge switch 20b for resetting electric charges in the electric charge storage sections 13, a wiring lead 21 for connecting the signal outputs from the transferring switches 20a to a signal processor to be described later, load capacitors 22 for storing and reading the electric charges transferred by the transferring switches 20a.

In the particular embodiment, an A-Si:H film is used as the semiconductor layer 5 which constitutes the photoelectric conversion unit 12, transferring switch 20a and discharge switch 20b. A silicon nitride film (SiNH) is formed by glow discharge as the insulating layer 4.

In FIG. 3A, only electrode wiring in the two upper and lower layers is shown in order to avoid complexity. Thus the semiconductor layer 5, insulating layer 4 and transparent insulating layers (passivation layer, adhesion layer, anti-wear layer) are not shown. The semiconductor layer 5 and insulating layer 4 are formed in the photoelectric conversion units 12, electric charge storage section 13 and switch section 20 as well as between the upper electrodes and the substrate.

In the wiring pattern of the photoelectric conversion apparatus of the particular embodiment shown, the signal channels output from the respective photoelectric conversion units are wired so as not to intersect other wiring leads to thereby prevent crosstalk among signal components and the induction of noise from the gate electrode wiring leads.

In the photoelectric conversion units, reference numerals 23 and 24 each denote the upper electrode and reference numeral 2 the opaque layer.

The electric charge storage section 13 includes lower layer electrode 3, and an insulating layer 4 and semiconductor layer 5 as a dielectric layer formed sequentially in this order on the lower layer electrode 3, and wiring leads continuing to the upper layer electrode 24 of the photoelectric conversion unit 12 and formed on the semiconductor layer 5. The electric charge storage section 13 has the same structure as a so-called MIS (Metal-Insulator-Semiconductor) capacitor.

FIG. 3C shows the switch section 20 of TFT structure including transferring switch 20a and discharge switch 20b. The transferring switch 20a includes lower layer electrode 25 as a gate electrode, insulating layer 4 constituting a gate insulating layer, semiconductor layer 5, upper layer electrode 24 as a source electrode, and upper layer electrode 26 as a drain electrode. The gate insulating layer of the discharge switch 20b and the photoconductive semiconductor layer are the same layers as the insulating layer 4 and photoconductive semiconductor layer 5. The source electrode includes the upper layer electrode 24, the gate electrode includes the lower layer electrode 27, and the drain electrode includes the upper layer electrode 28. The lower layer electrode 29 is connected to the gate electrode of the transferring switch 20a.

Formed on the upper layer electrode is a transparent insulating layer (passivation A layer) 301 which is mainly intended to protect and stabilize the semiconductor layer surface. A high-hardness transparent insulating layer 303 called an anti-frictional layer is provided so as to constitute the uppermost layer of the apparatus, which a document directly contacts, in order to protect the entire apparatus from damage caused by the moving document. A transparent insulating layer (passivation B layer) 302 is formed between the transparent insulating layer 301 and anti-frictional layer in order to improve adhesion and humidity resistance.

In the particular embodiment, the transparent insulating layer 301 is made of a polyimide resin coating, the transparent insulating layer 302 is made of an epoxy resin coating, and the transparent insulating layer 303 is made of a microsheet glass of the order of 50 μm.

Figure 2:
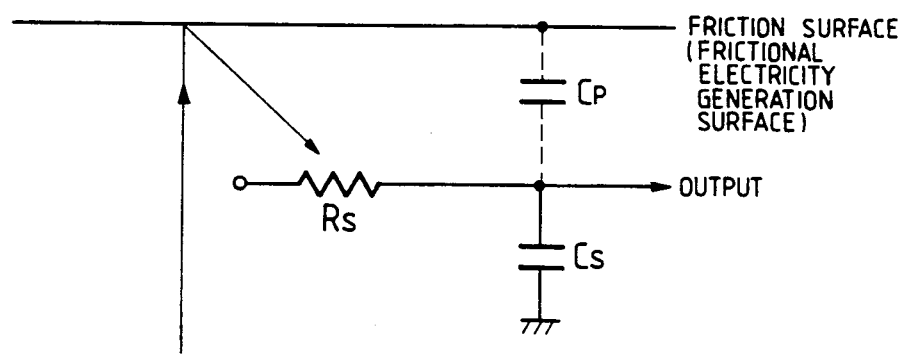
FIG. 2 is an equivalent circuit diagram of the structure of the conventional image reader.

As shown in FIG. 3B and FIG. 2, the light emitted by a light source (not shown) disposed on the back side of the transparent insulating substrate 1 is irradiated onto a document 7 through the opening 10 provided in the opposite surface of the substrate 1 and reflected by the document 7 so as to be irradiated onto the photoelectric conversion unit 12. The light irradiated through the spacing 11 between the upper layer electrodes 23 and 24 changes the conductivity of the semiconductor layer 5. The electric charges produced by photoelectric conversion at the photoelectric conversion units 12 (corresponding Rs in FIG. 4) are stored in the electric charge storage section 13 (corresponding Cs in FIG. 4), as in the conventional photoelectric conversion apparatus shown in FIGS. 1 and 2.

The structure of the present invention is characterized in that as shown in FIG. 3, the upper layer electrode 6a of the photoelectric conversion unit 12 and the lower electrode 3 of the charge storage section 13 are connected through a throughhole 9, so that the electric charges produced by photoelectric conversion at the photoelectric conversion section 12 are stored in the lower electrode 3 and that the upper layer electrode 6b is connected to a point of which the potential does not substantially fluctuate, for example, to ground GND.

The advantages provided by such structure will now be described.

The transparent insulating protective layer 303 surface which constitutes a static charge generating surface and the lower layer electrode 3 constituting the output of the electric charge storage section 13 are connected through capacitors Cpb constituted by the protective layers 301, 302 and 303 and capacitors Cs constituted by the semiconductor layer 5 and insulating layer 4. They, however, are not influenced by possible static charges on the transparent insulating protective layer 303 because the upper layer electrode 6b is connected to GND. A stray capacitance Cpa which is formed by the throughhole 9 can be reduced to a very small value, so that the protective layer 303 surface and the lower layer electrode 3 are substantially protected from the influence of static electric charges.

The method of manufacturing a photoelectric conversion apparatus according to the present invention will now be described.

FIG. 5 illustrates the steps of manufacturing the photoelectric conversion apparatus according to the present invention wherein the photoelectric conversion unit 12, the charge storage section 13, a transfer thin film transistor unit 14 which transfers stored charges and a signal line wiring matrix 15 are formed simultaneously.

In order to facilitate the understanding of the manufacturing steps, the cross section of the photoelectric conversion apparatus in the manufacturing steps is drawn schematically in FIG. 5 and has no direct corresponding relationship to the apparatus of FIG. 3. However, the apparatus of FIG. 3 is manufactured by similar steps.

Figure 5A:
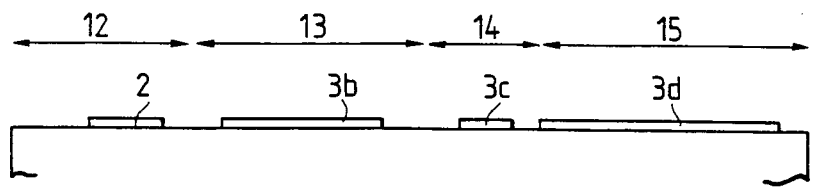
FIGS. 5A to 5E illustrate the steps of manufacturing the photoelectric conversion apparatus according to the present invention.
Figure 5B:
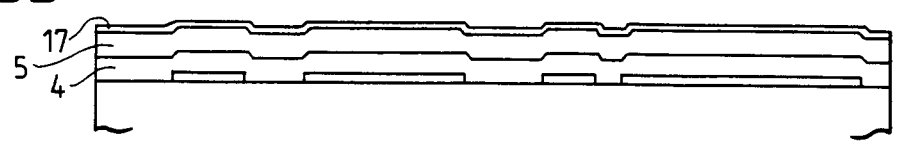

A glass baseplate (manufactured by Corning) both surfaces of which were polished was cleaned in an ordinary manner using neutral or organic alkali cleaner. Cr (chromium) was then deposited on the baseplate so as to be 0.1 $\mu$m thick by electron beam vapor deposition. A desired photoresist pattern was formed of a positive type photoresist (AZ-1370 manufactured by Sipley). Unnecessary Cr portions were then removed by an etching using a mixed aqueous solution of ceric ammonium nitrate and perchloric acid to form the opaque layer 2 of the photoelectric conversion unit, the lower layer electrode 3d of the wiring matrix, the lower layer electrode 3b of the capacitor section and the gate electrode 3c of the thin film transistor section (FIG. 5B).

The glass baseplate 1 was set in a capacitance coupling type glow discharge decomposition device and maintained at 230° C. under an atmosphere of $1 \times 10^{-6}$ Torr. $SiH_4$ diluted with $H_2$ to 10% and $NH_3$ were then fed simultaneously at flow rates of 5 and 20 SCCM, respectively, into the decomposition device. A glow discharge was performed for two hours at 15 W of RF discharge power using a 13.56 MHz high frequency power source to form an insulating layer 4 of silicon nitride having a thickness of 0.3 $\mu$m. $SiH_4$ gas was then fed at 10 SCCFM, glow discharge was performed for 2.5 hours at a gas pressure of 0.7 Torr and at a discharge power of 8 W to thereby form an amorphous silicon intrinsic layer 5 comprising a semiconductor layer having a thickness of 0.50 $\mu$m. Subsequently, a mixed gas of $SiH_4$ diluted with $H_2$ to 10% and $PH_3$ diluted with $H_2$ to 100 ppm mixed at a ratio of 1:10 was used as a source gas to form an n+-layer 17 having a thickness of 0.12$\mu$ which comprises an ohmic contact layer at a discharge power of 30 W (FIG. 5(B)).

Figure 5C:
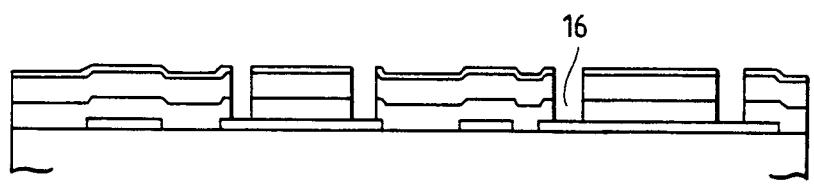

A contact hole pattern was formed of a positive type photoresist (OFPR-1300 manufactured by Tokyo Ooka). Then dry etching was performed using $CF_4$ gas at a pressure of 0.30 Torr and at an RF discharge power of 100 W by a plasma etching process to eliminate unnecessary portions of the n+-layer and amorphous silicon intrinsic layer and thus to form contact holes 16 (FIG. 5C).

Figure 5D:
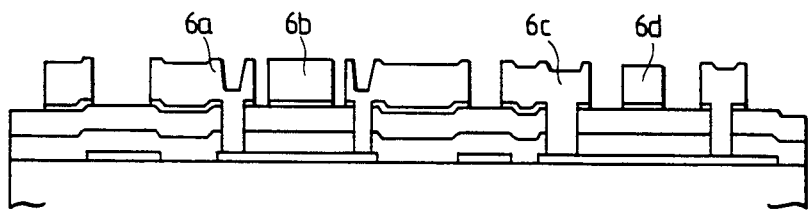

Aluminum was deposited so as to be 0.5 $\mu$m thick by an electron beam vapor deposition to form the conductive layer. Subsequently, a desired photoresist pattern was formed and the exposed conductive layer portions were eliminated in a mixed solution of phosphoric acid (aqueous 85% by volume solution), nitride acid (aqueous 60% by volume solution), glacial athetic acid and water mixed at a ratio in volume of 16:1:2:1 to form upper electrodes 6a, 6b, 6c and 6d. Thereafter, dry etching was performed using $CF_4$ gas by plasma etching process mentioned above to eliminate exposed n+-layer portions to form a desired n+-layer. Then the photoresist was separated (FIG. 5D).

An element separation photoresist pattern was then formed.

Figure 5E:
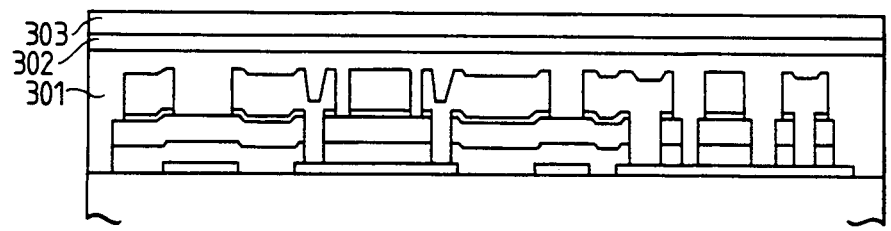

Only the intrinsic semiconductor layer was etched away using the element separation pattern as the mask. In that case, $CF_4$ gas was used as a reactive gas in a plasma etching process. By controlling the etching time, the intrinsic semiconductor layer of 6000 Å and the silicon nitride film were etched away by 500 Å with a silicon nitride film having about 2500 Å left among the elements. The transparent insulating protective layer (passivation A layer) 301 was formed of polyimide resin on the silicon nitride film. Epoxy resin was coated as the transparent insulating protective layer (passivation B layer) 302, and finally a microglass sheet was adhered to form the transparent insulating protective layer 303 (FIG. 5E).

A concrete example of an information processing apparatus having the photoelectric conversion apparatus according to the present invention will now be described as follows.

Figure 6:
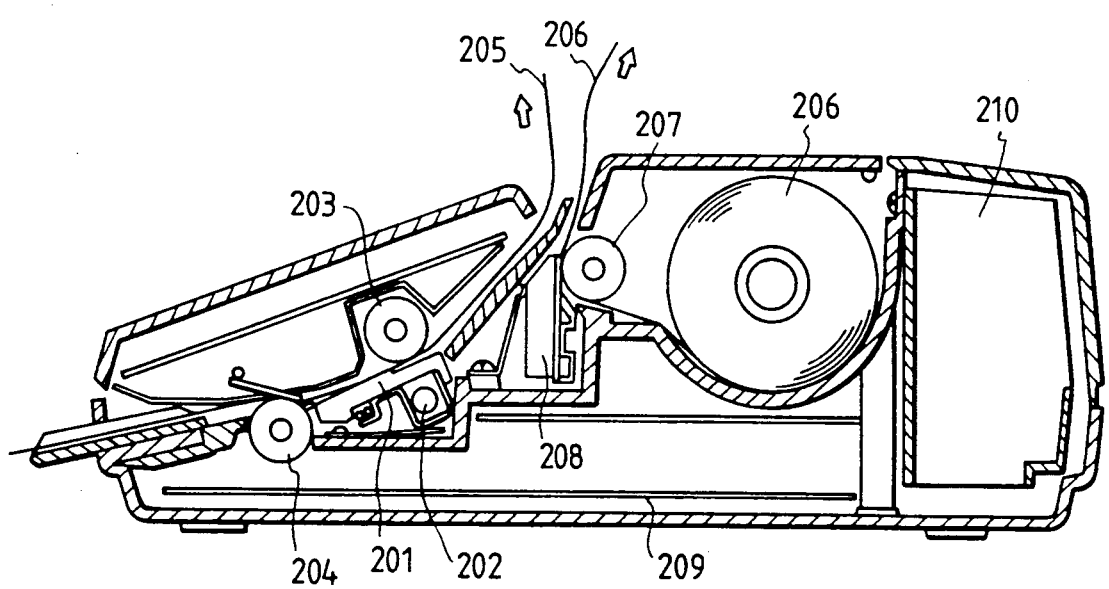
FIG. 6 is a schematic of a facsimile device utilizing an embodiment of the photoelectric conversion apparatus according to the present invention.

FIG. 6 is a schematic of a facsimile device using the photoelectric conversion apparatus according to the embodiment as the information processing apparatus.

In FIG. 6, at document transmission, a document 205 is pressed by a platen roller 203 against a contact type image sensor 201 and moved in the direction of the arrow by the platen roller 203 and a feed roller 204. The document is illuminated by a xenon lamp 202 constituting the light source, the reflected light is incident on the sensor 201 corresponding to the photoelectric conversion apparatus of the particular embodiment of the present invention and converted into an electrical signal corresponding to the image information on the document, and the signal is then transmitted. And ground lines of the contact type image sensor and the apparatus are electrically connected. The upper electrode of the charge storage portion is maintained at a constant voltage. At reception, a sheet of recording paper 206 is carried by a platen roller 207 and an image corresponding to the received signal is reproduced by a thermal head 208 on the sheet of recording paper.

The entire apparatus is controlled by a controller provided on a system control base base plate 209 and the respective drive systems and circuits are powered by a power source 210.

By the use of a photoelectric conversion apparatus of the described embodiment in such a device, level shifting of signals and malfunctions of the signal processors are prevented and errors in reading are reduced.

As described above in detail, according to the photoelectric conversion apparatus of the particular embodiment, the influence on the stored charges of static charges produced on the protective layer is alleviated or suppressed, and level shifting of signals, and the malfunction of signal processors are prevented.

We claim:

1. A photoelectric conversion apparatus comprising:
an insulating substrate;
a photoelectric conversion unit including a semiconductor layer and a pair of electrodes, provided on said insulating substrate;
an electric charge storage section provided on said insulating substrate, having a semiconductor layer and a pair of electrodes, one electrode being electrically connected to an electrode of said photoelectric conversion unit and the other electrode which is closest to an information-carrying original being kept at a constant potential;
an element driving unit, coupled to said electric charge storage section, having a semiconductor layer and an electrode, for reading an electric charge stored in said electric charge storage section; and
an insulating protection layer provided over said photoelectric conversion unit, said electric charge storage section, and said driving element unit so that said insulating protection layer can contact with the information-carrying original.

2. A photoelectric conversion apparatus according to claim 1, wherein said semiconductor layer of said electric charge storage section comprises hydrogenated amorphous silicon.

3. A photoelectric conversion apparatus according to claim 1, wherein said insulating protection layer comprises silicon nitride.

4. A photoelectric conversion apparatus according to claim 1, wherein said element driving unit comprises a thin film transistor.

5. A photoelectric conversion apparatus comprising:
a photoelectric conversion section, having an electrode, for receiving light reflected from an information-carrying original thereon, and for providing an electrical signal corresponding to the received light; and
an electric charge storage section, coupled to said photoelectric storage section, having one electrode electrically connected to said electrode of said photoelectric conversion unit, said electric charge storage section storing the electrical signal provided from said photoelectric conversion section and comprising a lamination structure including a dielectric layer and said one and second electrodes respectively provided at upper and lower sides of said dielectric layer, wherein one of the electrodes which is closest to the information-carrying original is maintained at a constant potential.

6. A photoelectric conversion apparatus according to claim 5, further comprising an insulating substrate upon which said photoelectric conversion section and said electric charge storage section are mounted, and wherein said photoelectric conversion section includes a plurality of photoelectric conversion units arranged in a straight line so as to correspond to an overall width of the imformating-carrying original when placed on top of the photoelectric conversion units, and wherein a reflection of light irradiated onto the imformation-carrying original through a back side of said insulating substrate is received by the photoelectric conversion units.

7. A photoelectric conversion apparatus according to claim 5, wherein said dielectric layer includes an insulating layer and a semiconductor layer.

8. A photoelectric conversion apparatus according to claim 3, wherein said semiconductor layer comprises hydrogenated amorphous silicon.

9. A photoelectric conversion apparatus according to claim 5, wherein said electrode closest to the imformation-carrying original is grounded.

10. An information processing apparatus comprising:
(1) photoelectric conversion means including;
a substrate having a light transparent area;
a photoelectric conversion unit provided on said substrate and having two electrodes; and
a charge storage section having one electrode electrically connected to an electrode of said photoelectric conversion unit;
(2) a light source for illuminating an information-carrying original through said light transparent area of said substrate; and
(3) transferring means for transferring the imformation-carrying original to a reading position so that the original is read by said photoelectric conversion unit;
wherein said charge storage section includes a lamination structure comprising a dielectric layer and said one and second electrodes provided at upper and lower sides of said dielectric layer, said second charge storage section electrode which is closer to the imformation-carrying original being maintained at a constant potential.

11. An information processing apparatus according to claim 10, wherein said electrode which is closer to the imformation-carrying original is connected to a ground line.

12. An information processing apparatus according to claim 11, wherein said apparatus is incorporated in a facsimile machine.

* * * * *

UNITED STATES PATENT AND TRADEMARK OFFICE
CERTIFICATE OF CORRECTION

PATENT NO. 5,060,040

DATED     : October 22, 1991

INVENTOR(S) : Toshihiro Saika, et al.

It is certified that error appears in the above-identified patent and that said Letters Patent is hereby corrected as shown below:

<u>COLUMN 1</u>:

Line 20, "apparatus" should read --apparatuses--.

<u>COLUMN 4</u>:
Line 48, "sponding Rs" should read --sponding to Rs--; and
Line 49, "(corresponding Cs" should read --"(corresponding to Cs--.

<u>COLUMN 8</u>:
Line 10, "imformation-car-" should read --information-car- --;
Line 18, "claim 3," should read --claim 7,--;
Line 21, "imforma-" should read --informa- --;
Line 36, "original" should read --information-carrying original--; and
Line 43, "imformation-carrying" should read --information-carrying--.

Line 34, "imforma-" should read --informa- --.

Signed and Sealed this

Fifteenth Day of June, 1993

Attest:

MICHAEL K. KIRK

Attesting Officer    Acting Commissioner of Patents and Trademarks